United States Patent
Wang et al.

(10) Patent No.: US 7,265,373 B2
(45) Date of Patent: Sep. 4, 2007

(54) PHASE CHANGE MEMORY DEVICE AND METHOD OF MANUFACTURING

(75) Inventors: Chao-Hsiung Wang, Hsin-Chu (TW); Li-Shyue Lai, Jhube (TW); Denny Tang, Saratoga, CA (US); Wen-Chen Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 128 days.

(21) Appl. No.: 11/028,841

(22) Filed: Jan. 4, 2005

(65) Prior Publication Data

US 2006/0148229 A1    Jul. 6, 2006

(51) Int. Cl.
*H01L 47/00* (2006.01)
(52) U.S. Cl. .................. 257/4; 438/95; 257/E27.004
(58) Field of Classification Search .............. 257/4, 257/295, 300, 304; 438/95
See application file for complete search history.

(56) References Cited

U.S. PATENT DOCUMENTS

| | | | |
|---|---|---|---|
| 6,252,244 B1 | 6/2001 | Reinberg | |
| 6,511,862 B2 | 1/2003 | Hudgens et al. | |
| 6,512,241 B1 | 1/2003 | Lai | |
| 6,512,242 B1 | 1/2003 | Fan et al. | |
| 6,531,373 B2 | 3/2003 | Gill et al. | |
| 6,607,974 B2 | 8/2003 | Harshfield | |
| 6,635,951 B1 | 10/2003 | Zahorik | |
| 6,649,928 B2 | 11/2003 | Dennison | |
| 7,038,261 B2 * | 5/2006 | Horii ...................... | 257/295 |
| 2004/0248339 A1 * | 12/2004 | Lung ....................... | 438/102 |
| 2005/0042862 A1 * | 2/2005 | Zahorik .................. | 438/639 |
| 2006/0001164 A1 * | 1/2006 | Chang ..................... | 257/758 |

* cited by examiner

*Primary Examiner*—Quoc Hoang
(74) *Attorney, Agent, or Firm*—Haynes and Boone, LLP (57) ABSTRACT

A method of manufacturing a memory device including forming an electrode over a substrate, then forming a dielectric feature proximate a contact region of a sidewall of the electrode, and then forming a phase change feature proximate the contact region.

25 Claims, 6 Drawing Sheets

PHASE CHANGE MEMORY DEVICE AND METHOD OF MANUFACTURING

BACKGROUND

An integrated circuit (IC) is formed by creating one or more devices (e.g., circuit components) on a semiconductor substrate using a fabrication process. As fabrication processes and materials improve, semiconductor device geometries have continued to decrease in size since such devices were first introduced several decades ago. For example, current fabrication processes are producing devices having feature sizes (e.g., the smallest component or line that may be created) of less than 90 nm. However, the reduction in size of device geometries introduces new challenges that need to be overcome.

Media storage products typically follow the forefront of Moore's Law due to consumer demands for greater storage. Storage products may include non-volatile or volatile memory. Non-volatile memory, such as read-only memory (ROM), has the ability to permanently store information without electrical refresh to maintain the integrity of the information. Volatile memory, such as dynamic random access memory (RAM), requires electrical refresh of the device to maintain the integrity of the stored information. However, there exists a limited population of memory storage devices with the capabilities of both volatile and non-volatile memories. Furthermore, current methods of manufacturing are not adequate due to excessive processing steps and design layout, which can result in memory devices having inadequate electrical performance.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1:
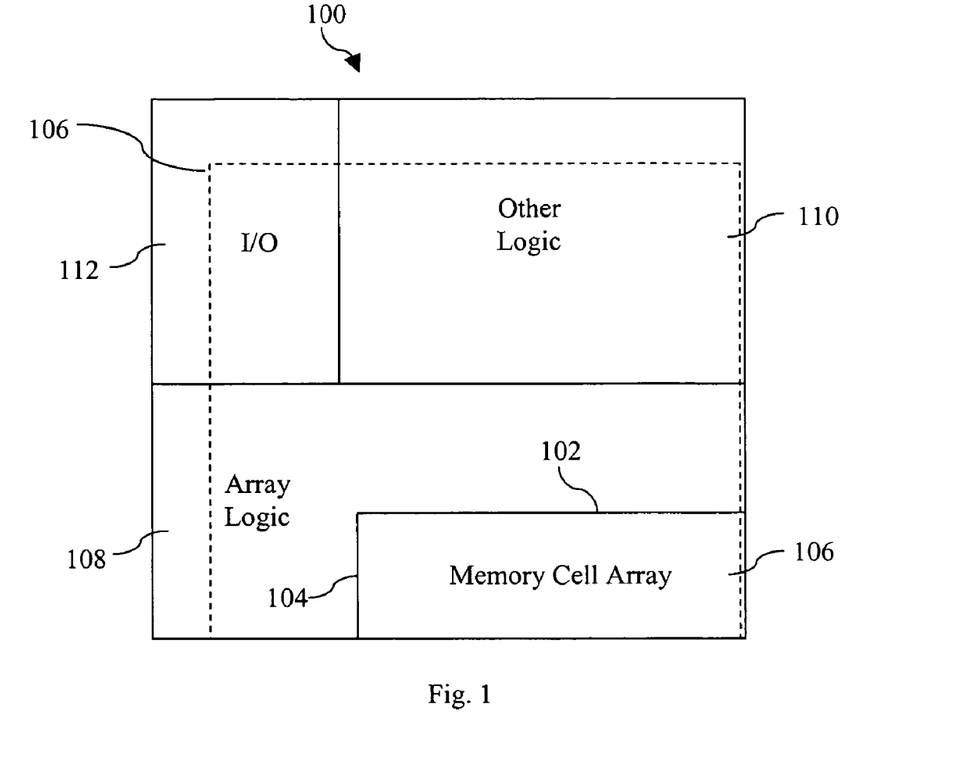
FIG. 1 is a block diagram of at least a portion of an embodiment of an integrated circuit device constructed according to aspects of the present disclosure.

Referring to FIG. 1, illustrated is a block diagram of an embodiment of an integrated circuit 100 according to aspects of the present disclosure. The integrated circuit 100 includes a memory cell array 106 that can be controlled by an array logic 108 through an interface 104. The array logic 108 may include various logic circuitry, including row and column decoders and sense amplifiers, and the interface 104 may include one or more bit lines, gate lines, digit lines, control lines, word lines, and/or other communication paths interconnecting the memory cell array 106 with the array logic 108. The memory cell array 106 geometry may vary and may be located partially or substantially over the array logic 108, I/O circuits 112 (e.g., buffers and drivers), and/or other logic 110 (e.g., counters, clock circuits, and processing circuits). These communication paths will hereinafter be referred to as bit lines, it being understood that different applications of the present disclosure may use different communication paths.

Figure 2:
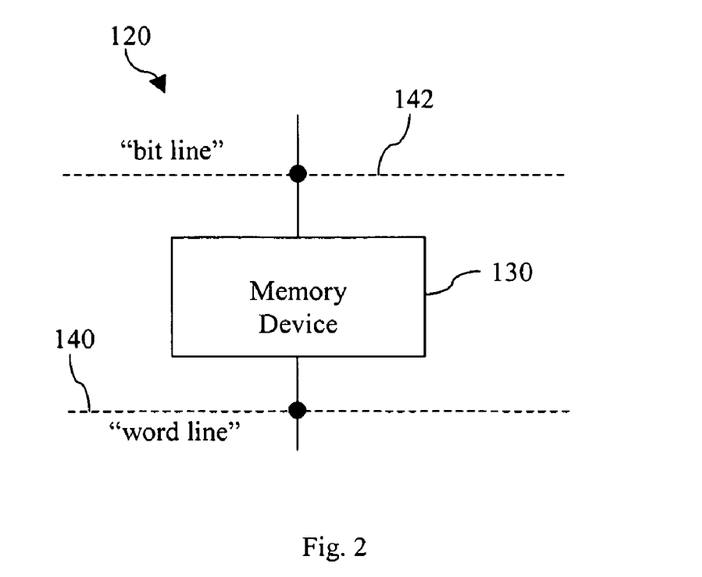
FIG. 2 is a block diagram of at least a portion of an embodiment of a memory cell constructed according to aspects of the present disclosure.

Referring to FIG. 2, illustrated is a circuit diagram of an embodiment of a memory cell 120 including a memory device 130, at least one word line 140, and at least one bit line 142. The memory cell 120 may include a plurality of semiconductor doped regions, conductive materials, and/or electrically insulating materials. The memory device 130 may include a plurality of semiconductor layers to provide for the storage of at least one binary logical state. For example, memory device 130 may include a material layer which may store a logical state in response to thermal energy or a magnetic field. The response may correspond to a detectable change of the electrical and/or crystalline material properties(s) to provide at least one memory function. For example, the word line 140 may include at least one conductive interconnect proximate the memory device 130 such that the word line 140 may provide a current to induce ohmic heating of the memory device 130. Similarly the bit line 142 may include at least one conductive interconnect proximate the memory device 130 for reading and/or writing information to the memory device 130.

Figure 3:
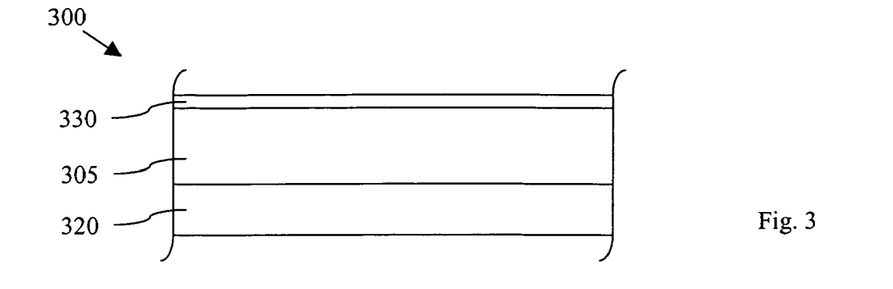
FIG. 3 is a sectional view of at least a portion of one embodiment of a memory device array in an intermediate stage of manufacture according to aspects of the present disclosure.

Referring to FIG. 3, illustrated is a sectional view of one embodiment of a memory device array 300 in an initial stage of manufacture according to aspects of the present disclosure. In the illustrated stage of manufacture, the array 300 includes a conductive layer 305 formed over a substrate 320. The array 300 may also include a protective layer 330 formed over the conductive layer 305.

The substrate 320 may be or comprise a silicon-on-insulator (SOI) substrate, a polymer-on-silicon substrate, silicon, gallium arsenide, gallium nitride, strained silicon, silicon germanium, silicon carbide, carbide, diamond, and/or other materials. In one embodiment, the substrate 320 comprises a fully depleted SOI substrate wherein a active device silicon layer thickness may range between about 200 nm and about 50 nm. The substrate 320 may also include an air gap providing insulation for the memory array 300. For example, the substrate 320 may be or comprise a "silicon-on-nothing" (SON) substrate including a thin insulation layer comprising air and/or other gaseous composition. The memory array 300 may also include a layer of silicon germanium with a silicon cap layer located over the silicon germanium layer, wherein the silicon germanium layer may be removed in a subsequent step. The silicon cap layer may become a device active region for the memory array 300. The silicon cap layer may be located over a gap formed by the removal of the silicon germanium layer. The gap may include air and/or other dielectric material.

The conductive layer 305 may comprise one or more layers of polysilicon, metal, and/or other materials. For example, the conductive layer 305 may comprise Ti, TiN, Ta, TaN, Cu, Al, Mo, Co, W, WN, molybdenum silicide, tungsten silicide, cobalt silicide, and/or other materials. The conductive layer 305 may be formed by atomic layer deposition (ALD), chemical vapor deposition (CVD), metal-organic CVD (MOCVD), plasma-enhanced CVD (PECVD), evaporation, and/or other methods, possibly to a thickness ranging between about 1000 angstroms and about 8000 angstroms. With some materials, the conductive layer 305 may be formed by selective deposition over the substrate 320, while with other materials the conductive layer 305 may be formed by blanket deposition, possibly followed by a patterning process. Such patterning may include wet and/or dry etching, possibly employing a mask, masking process, and/or photolithographic processes.

The protective layer 330 may include organic dielectric material, such as photo resist, polymer, inorganic dielectric material such as silicon nitride (including nitrogen-containing dielectric material, such as $Si_3N_4$, SiON, $SiN_xH_y$, etc.), silicon oxide ($Si_xO_y$), carbon-containing dielectric material (including SiC, SiCN, etc.), and/or other materials. The protective layer 330 may provide an etch stop indicator to prevent damage to the conductive layer 305 during subsequent processing. The composition of the protective layer 330 may also be selected to achieve a particular selectivity during subsequent chemical-mechanical polishing or chemical-mechanical planarizing (collectively referred to herein as CMP), etching, and/or other material removal processes.

The protective layer 330 may have a thickness ranging between about 100 angstroms and about 800 angstroms. However, other thicknesses may also be employed. The thickness of the protective layer 330 may depend on dimensions and/or characteristics of subsequently formed contact areas, the etch selectivity between the protective layer 330 and subsequently formed spacers, and/or a removal process employed to subsequently remove at least a portion of the protective layer 330. For example, if CMP is employed to remove at least a portion of the protective layer 330, the as-formed thickness of the protective layer 330 may be different than if an etch-back process is employed. In one embodiment, the thickness of the protective layer 330 ranges between about 0.3 and about 2.5 times the thickness or height of subsequently formed contact areas (described below).

Figure 4:
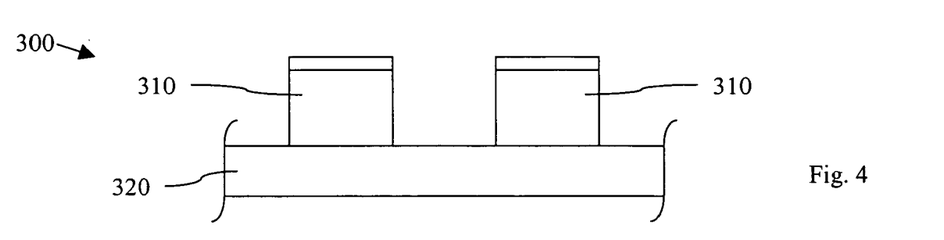
FIG. 4 is a sectional view of the memory array shown in FIG. 3 in a subsequent stage of manufacture according to aspects of the present disclosure.

Referring to FIG. 4, illustrated is a sectional view of the array 300 shown in FIG. 3 in a subsequent stage of manufacture according to aspects of the present disclosure. The conductive layer 305 and the protective layer 330, if employed, are patterned to form one or more electrodes 310. Such patterning may comprise wet and/or dry etching, possibly employing a mask, masking process, and/or photolithographic processes. In other embodiments, the electrodes 310 may be formed by selective deposition, such that subsequent patterning may not be necessary.

Figure 5:
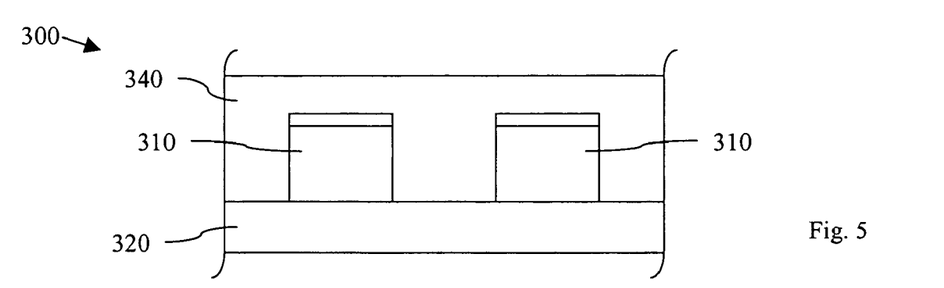
FIG. 5 is a sectional view of the memory array shown in FIG. 4 in a subsequent stage of manufacture according to aspects of the present disclosure.

Referring to FIG. 5, illustrated is a sectional view of the array 300 shown in FIG. 4 in a subsequent stage of manufacture according to aspects of the present disclosure. A dielectric layer 340 is or may be formed over the electrodes 310 and the substrate 320. The dielectric layer 340 may comprise silicon oxide, doped oxide (such as fluorinated silicate glass (FSG), phosphosilicate glass (PSG), etc.) polymer, low-k dielectric material (such as SiOC), and/or other electrically insulating materials. In one embodiment, the dielectric constant of the dielectric layer 340 is less than about 3.9, such as for a compromised thermal conductivity and capacitance between the electrodes 310. The dielectric layer 340 may be formed over the substrate 320 by ALD, CVD, PECVD, physical-vapor deposition (PVD), evaporation, and/or other processes.

Figure 6:
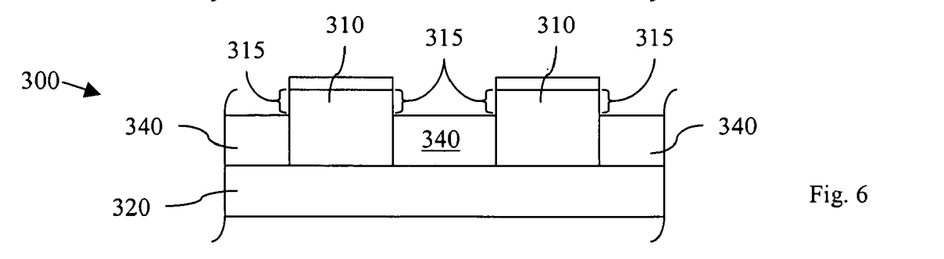
FIG. 6 is a sectional view of the memory array shown in FIG. 5 in a subsequent stage of manufacture according to aspects of the present disclosure.

Referring to FIG. 6, illustrated is a sectional view of the array 300 shown in FIG. 5 in a subsequent stage of manufacture according to aspects of the present disclosure. One or more portions of the dielectric layer 340 may be removed to expose portions 315 of the conductive portion of the electrodes 310 which may function as contact regions in some embodiments. Such removal may comprise CMP, wet etching, and/or dry etching, possibly employing a mask, masking process, and/or photolithographic processes. The height of the exposed portions 315 (e.g., substantially perpendicular to the substrate 320) may be less than about 50% of the thickness of the electrode 310, and may range between about 50 angstroms and about 1000 angstroms, possibly depending on cell density and circuit design.

Figure 7:
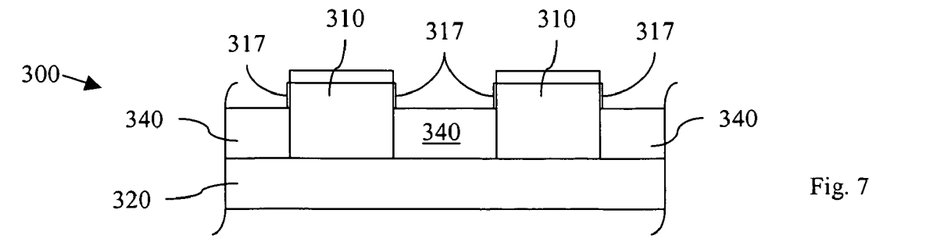
FIG. 7 is a sectional view of the memory array shown in FIG. 6 in a subsequent stage of manufacture according to aspects of the present disclosure.

Referring to FIG. 7, illustrated is a sectional view of the array 300 shown in FIG. 6 in a subsequent stage of manufacture according to aspects of the present disclosure. The exposed portions 315 of the conductive portion of the electrodes 310 may be treated by ion implantation to formed treated portions 317. The ion implantation may employ impurity implant energy ranging between about 1 KeV and about 800 KeV and an impurity concentration ranging between about $1 \times 10^{13}$ atoms/cm$^3$ and about $1 \times 10^{19}$ atoms/cm$^3$. The ion implantation may also treat at least an exposed portion of the dielectric layer 340. The electrical resistance of the dielectric layer 340 and/or the electrodes 310, or at least the treated portions 317 of the electrodes 310, may be increased by the ion implantation to further reduce the amount of current needed to change the material phase of a phase change material formed in a subsequent step.

In one embodiment, the ion implantation may be performed by plasma source ion implantation or plasma source ion immersion (collectively referred to herein as PSII). PSII may include a process wherein treated portions may be exposed to a plasma source, possibly while a bias may be applied to the substrate 320. The processing tool employed to perform PSII may include a single and/or batch wafer reactor, wherein a direct current (DC) and/or radio frequency (RF) bias may be applied to the substrate 320. The PSII reactor may employ a process ambient pressure may range between 0.01 mTorr and about 1000 Torr. The substrate 320 may be held at a temperature ranging between 150° C. and about 1100° C. High density plasma may be produced by a microwave electron cyclotron resonance (ECR) plasma, a helicon plasma, an inductively coupled plasma, and/or other high density plasma sources. The plasma may include Ar, H, N, Xe, O, As, $B_2H_6$, $GeH_4$, P, and/or other sources. The plasma may utilize RF powers ranging between about 200 Watts and about 2500 Watts. The applied bias may range between about ±200 V and about ±5000 V. The application of the bias to the substrate 320 in the presence of plasma may create an extended plasma sheath substantially covering the array 300, wherein ions and/or electrons may be accelerated away from the plasma sheath, thereby accelerating the ions of the impurity into the portions of the array 300 being treated.

Figure 8:
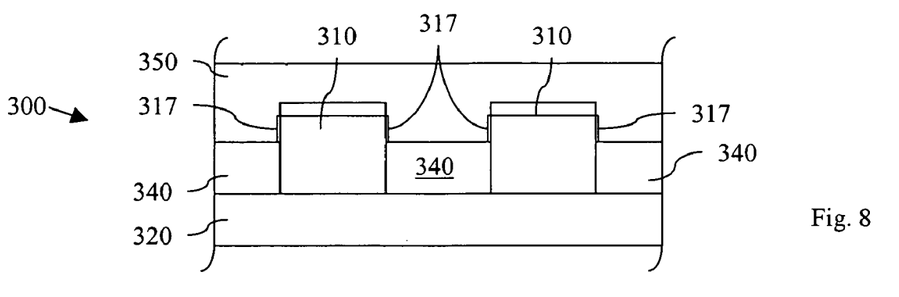
FIG. 8 is a sectional view of the memory array shown in FIG. 7 in a subsequent stage of manufacture according to aspects of the present disclosure.

Referring to FIG. 8, illustrated is a sectional view of the array 300 shown in FIG. 7 in a subsequent stage of manufacture according to aspects of the present disclosure. A phase change material layer 350 is formed over the electrodes 310 and the dielectric layer 340. The phase change material layer 350 may directly contact the electrodes 310, such that the exposed portions 315 (or treated portions 317) of the electrodes form contact areas with the phase change material layer 350, as in the illustrated embodiment. However, additional features may be formed interposing the phase change material layer 350 and the electrodes 310 at or near the contact areas.

The phase change material layer 350 may comprise a chalcogenide material adapted for material phase change, such as by an induced stimuli from the electrodes 310 and/or other member(s). The chalcogenide material may comprise a material that exhibits different electrical characteristics dependent upon the material state. The material state may represent a status of the crystalline structure of the chalcogenide, such as an amorphous structure or a crystalline structure, wherein the chalcogenide may transform between various levels of amorphous and crystalline orientations, such as in response to stimulus from the electrodes 310. That is, the phase change material layer 350 may exhibit a plurality of crystalline and corresponding electrical states. Consequently, the phase change material layer 350, or features defined therefrom, allows for binary or additional states of memory storage. The phase change material layer 350 may be transmuted into different material phases through ohmic heating, such as by a current propagating through the electrodes 310. For example, current may be supplied through the electrodes 310 in pulses for writing to features defined from the phase change material layer 350.

The phase change material layer 350 may comprise binary, ternary, quaternary, and/or other material alloys. For example, binary alloys may include GaSb, InSb, InSe, $Sb_2Te_3$, GeTe, and/or other alloys. Ternary alloys may include $Ge_2Sb_2Te_5$, InSbTe, GaSeTe, $SnSb_2Te_4$, InSbGe, and/or other alloys. Quaternary alloys may include AgInSbTe, (GeSn)SbTe, GeSb(SeTe), $Te_{81}Ge_{15}Sb_2S_2$, and/or other alloys. The phase change material layer 350 may also comprise Si, diamond, GaAs, and/or other materials. The phase change material layer 350 may be formed by PVD (such as sputter deposition), laser ablation, CVD (such as ALD, MOCVD, and/or PECVD), evaporation, spin-on coating, molecular beam epitaxy (MBE), sol-gel processing, and/or other processes. Formation of the phase change material layer 350 may also comprise ion implantation. For example, the phase change material layer 350 may comprise a Te alloy implanted into Ge, silicon germanium, SiC, C, carbide, strained silicon germanium, and/or other materials.

Figure 9:
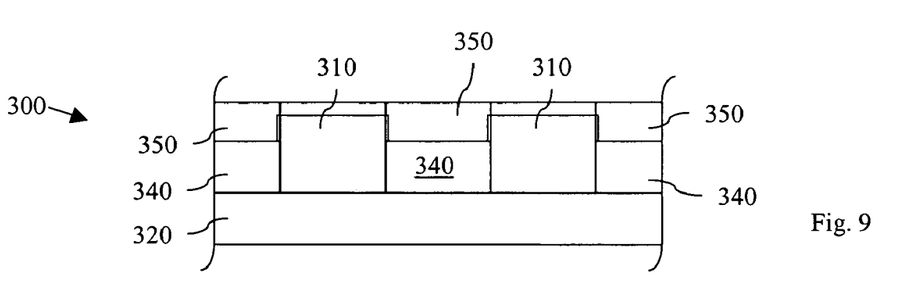
FIG. 9 is a sectional view of the memory array shown in FIG. 8 in a subsequent stage of manufacture according to aspects of the present disclosure.

Referring to FIG. 9, illustrated is a sectional view of the array 300 shown in FIG. 8 in a subsequent stage of manufacture according to aspects of the present disclosure. The phase change material layer 350 may be planarized, such as by CMP, to be substantially coplanar with the electrodes 310. However, the phase change material layer 350 may also extend away from the substrate 320 beyond the electrodes 310, such as by altering the process(es) employed to planarized the phase change material layer 350. Moreover, one or more wet and/or dry etching processes may be employed instead of or in addition to CMP processes to planarize the phase change material layer 350.

Figure 10:
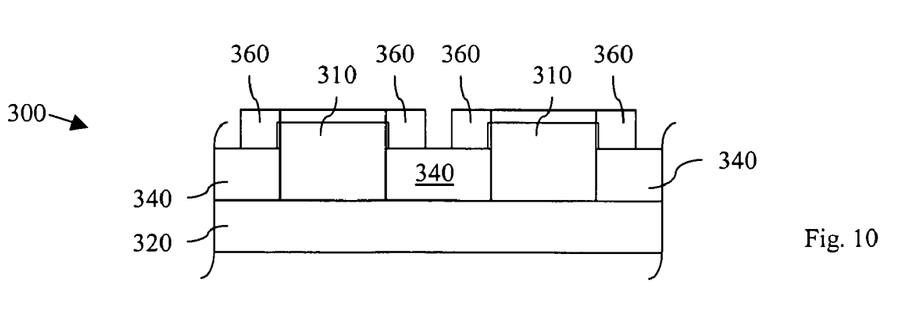
FIG. 10 is a sectional view of the memory array shown in FIG. 9 in a subsequent stage of manufacture according to aspects of the present disclosure.

Referring to FIG. 10, illustrated is a sectional view of the array 300 shown in FIG. 9 in a subsequent stage of manufacture according to aspects of the present disclosure. The phase change material layer 350 is patterned to form phase change features 360. Such patterning may include wet and/or dry etching, possibly employing a mask, masking process, and/or photolithographic processes.

Figure 11:
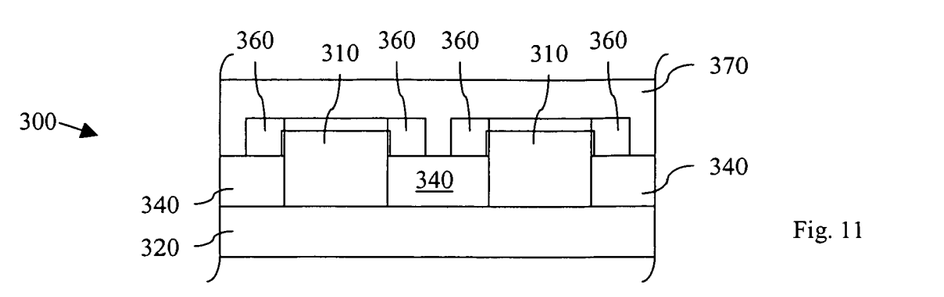
FIG. 11 is a sectional view of the memory array shown in FIG. 10 in a subsequent stage of manufacture according to aspects of the present disclosure.

Referring to FIG. 11, illustrated is a sectional view of the array 300 shown in FIG. 10 in a subsequent stage of manufacture according to aspects of the present disclosure. A dielectric layer 370 is formed over the phase change features 360, the electrodes 310, and the dielectric layer 340. The dielectric layer 370 may comprise silicon oxide, doped oxide (such as FSG, PSG, etc.), polymer, low-k dielectric material (such as SiOC), and/or other electrically insulating materials, and may be formed by ALD, CVD, PECVD, physical-vapor deposition (PVD), evaporation, and/or other processes.

Figure 12:
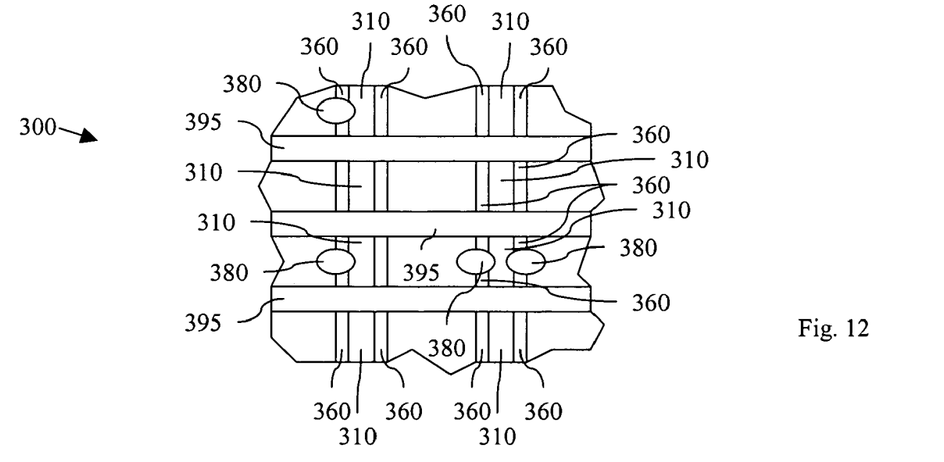
FIG. 12 is a top view of the memory array shown in FIG. 11 in a subsequent stage of manufacture according to aspects of the present disclosure.
Figure 13:
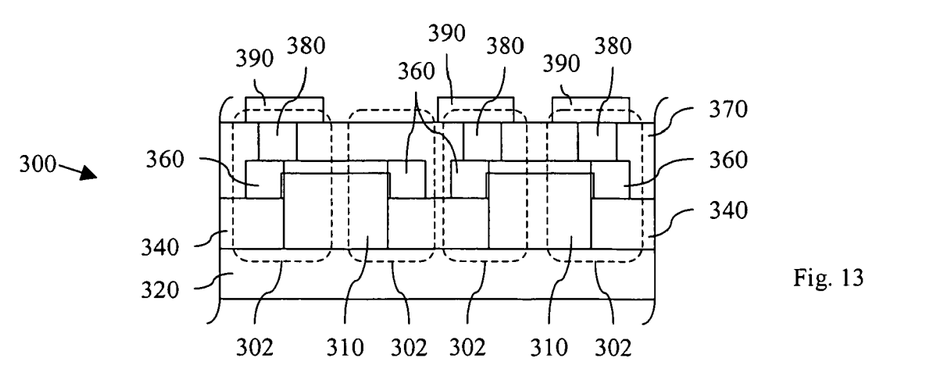
FIG. 13 is a sectional view of the memory array shown in FIG. 11 in a subsequent stage of manufacture according to aspects of the present disclosure.

Referring to FIGS. 12 and 13, collectively, illustrated are a top view and a sectional view, respectively, of the array 300 shown in FIG. 11 in a subsequent stage of manufacture according to aspects of the present disclosure. Individual memory devices 302, such as those indicated by dashed lines in FIG. 13, may be defined from the previously formed electrodes 310 and phase change features 360. Such definition may include patterning, such as by wet and/or dry etching, possibly employing one or more masks 395. Such masks 395 may comprise photoresist, polymer, and/or other materials.

Electrodes 380 may be formed in the dielectric layer 370 and contacting the phase change features 360. The electrodes 380 may comprise copper, tungsten, gold, aluminum, carbon nano-tubes, carbon fullerenes, refractory metals, and/or other materials, and may be formed by CVD, ALD, PVD, damascene, dual-damascene, and/or other processes.

The array 300 may also include interconnects 390 formed over the dielectric layer 370 and contacting the electrodes 380. The interconnects 390 may comprise copper, tungsten, gold, aluminum, carbon nano-tubes, carbon fullerenes, refractory metals, and/or other materials, and may be formed by CVD, ALD, PVD, damascene, dual-damascene, and/or other processes.

Each of the devices 302 may comprise one or more phase change features 360 and one or more electrodes 310, 380. For example, all of the devices 302 may comprise at least one electrode 380 and at least one phase change feature 360, while in other embodiments other configurations may be employed. Two or more of the devices 302 may also share one electrode 310 or one electrode 380. The array 300 may comprise any number of devices 302 within the scope of the present disclosure, as well as one or more other types of memory devices. Moreover, one or more of the fabrication steps described above may be omitted or performed in a different sequence than described above. Methods of manufacturing the memory devices 302 and array 300 according to aspects of the present disclosure may also comprise process steps in addition to those described above.

Figure 14:
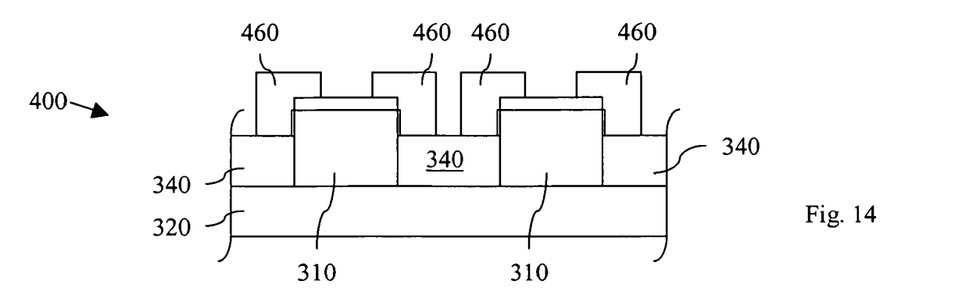
FIG. 14 is a sectional view of another embodiment of the memory array shown in FIG. 9 according to aspects of the present disclosure.

Referring to FIG. 14, illustrated is a sectional view of another embodiment of the memory array 300 shown in FIG. 9 according to aspects of the present disclosure, herein designated by the reference numeral 400. The array 400 may be substantially similar to the array 300 described above, with the following exceptions.

As mentioned above, the phase change material layer 350 may also be patterned such that resulting phase change features 460 extend beyond the electrodes 310 in a direction substantially perpendicular to the substrate 320. Such patterning may comprise CMP, wet etching, and/or dry etching, possibly employing a mask, masking process, and/or photolithographic processes. For example, the CMP or other process employed to define the phase change features 460 may be more selective to the protective layers 410 and/or the electrodes 310 than to the phase change features 460. Accordingly, the phase change features 460 may extend beyond the electrodes 310 and the protective layers 410, if included, by an amount ranging between about 100 angstroms and about 1000 angstroms. Thus, the phase change features 460 may extend beyond the electrodes 310 despite being formed after the electrodes 310. The phase change features 460 may also extend at least partially over the electrodes 310 in a direction substantially parallel to the substrate 320. Extending the phase change features 460 beyond the electrodes 310 may provide a significant reduction of the contact resistance to a bit line (e.g., the bit line 142 shown in FIG. 2 or other lines employed in the operation of the memory array 400).

Figure 15:
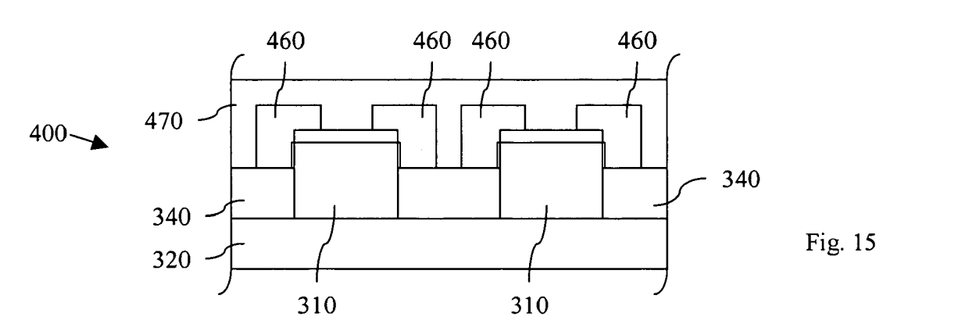
FIG. 15 is a sectional view of the memory array shown in FIG. 14 in a subsequent stage of manufacture according to aspects of the present disclosure.

Referring to FIG. 15, illustrated is a sectional view of the array 400 shown in FIG. 14 in a subsequent stage of manufacture according to aspects of the present disclosure. A dielectric layer 470 is formed over the phase change features 460, the electrodes 310, and the dielectric layer 340. The dielectric layer 370 may comprise silicon oxide, doped oxide (such as FSG, PSG, etc.), polymer, low-k dielectric material (such as SiOC), and/or other electrically insulating materials, and may be formed by ALD, CVD, PECVD, physical-vapor deposition (PVD), evaporation, and/or other processes.

Figure 16:
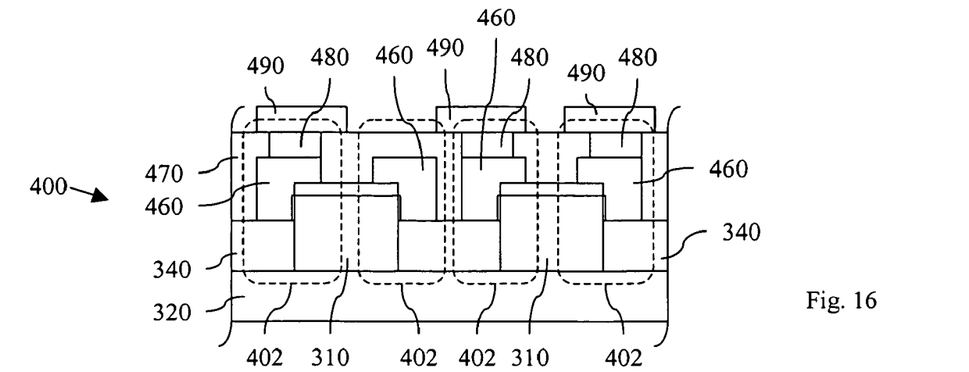
FIG. 16 is a sectional view of the memory array shown in FIG. 15 in a subsequent stage of manufacture according to aspects of the present disclosure.

Referring to FIG. 16, illustrated is a sectional view of the array 400 shown in FIG. 15 in a subsequent stage of manufacture according to aspects of the present disclosure. Electrodes 580 may be formed in the dielectric layer 570 and contacting the phase change features 560. The electrodes 580 may comprise copper, tungsten, gold, aluminum, carbon nano-tubes, carbon fullerenes, refractory metals, and/or other materials, and may be formed by CVD, ALD, PVD, damascene, dual-damascene, and/or other processes.

The array 400 may also include interconnects 490 formed over the dielectric layer 470 and contacting the electrodes 480. The interconnects 490 may comprise copper, tungsten, gold, aluminum, carbon nano-tubes, carbon fullerenes, refractory metals, and/or other materials, and may be formed by CVD, ALD, PVD, damascene, dual-damascene, and/or other processes.

At the manufacturing stage illustrated in FIG. 16, the array 400 includes a plurality of memory devices 402. Each of the devices, indicated by dashed lines in FIG. 16, may comprise one or more phase change features 460 and one or more electrodes 310, 480. Although only two such devices 402 are shown in FIG. 16, the array 400 may comprise any number of such devices 402 within the scope of the present disclosure, as well as one or more other types of memory devices. Two or more of the devices 402 may also share one electrode 310. Moreover, one or more of the fabrication steps described above may be omitted or performed in a different sequence than described above. Methods of manufacturing the memory devices 402 and array 400 according to aspects of the present disclosure may also comprise processing steps in addition to those described above.

Figure 17:
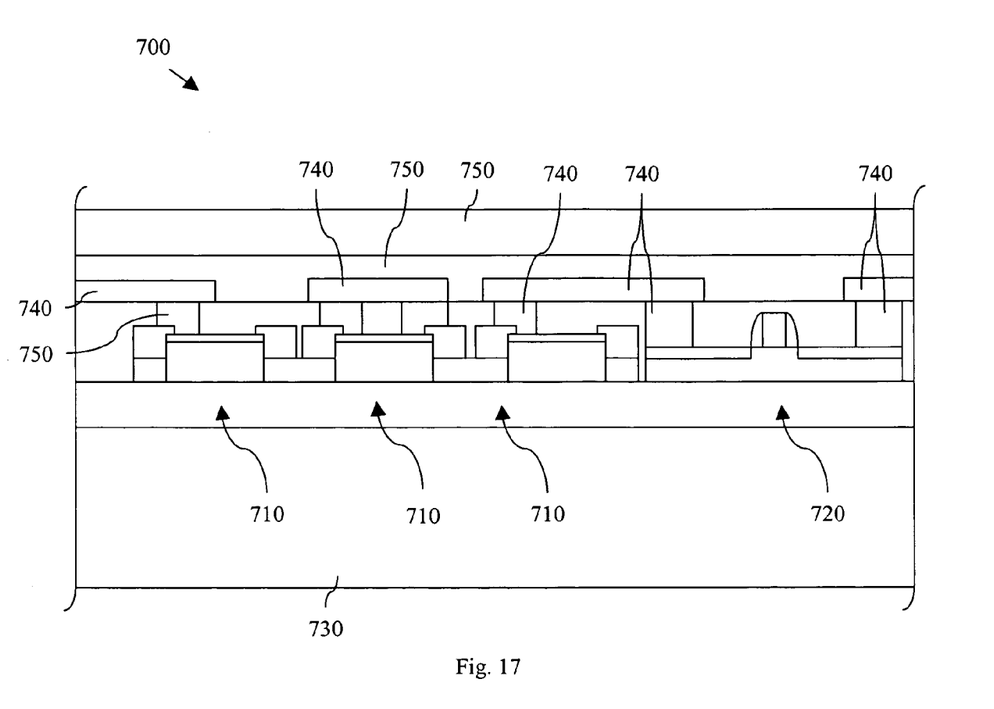
FIG. 17 is a sectional view of at least a portion of one embodiment of an integrated circuit device according to aspects of the present disclosure.

Referring to FIG. 17, illustrated is a sectional view of one embodiment of an integrated circuit device 700 constructed according to aspects of the present disclosure. The integrated circuit device 700 is one environment in which aspects of the above-described microelectronic devices may be implemented. For example, the integrated circuit device 700 includes a plurality of memory devices 710 located on or in a substrate 730, one or more of which may be substantially similar to one of the memory devices 300, 400 shown in FIGS. 13, 16, respectively. The memory devices 710 may be interconnected and/or connected to one or more other microelectronic devices 720 manufactured on and/or in the substrate 730. The microelectronic devices 720 may include metal-oxide-semiconductor field-effect-transistors (MOSFETs), FinFETs and/or other conventional or future-developed semiconductor devices.

The integrated circuit device 700 also includes interconnects 740 extending along and/or through one or more dielectric layers 750 to ones of the memory devices 710 and/or the microelectronic devices 720. The dielectric layers 750 may comprise silicon dioxide, Black Diamond® (a product of Applied Materials of Santa Clara, Calif.) and/or other materials, and may be formed by CVD, ALD, PVD, spin-on coating and/or other processes. The dielectric layers 750 may have a thickness ranging between about 1000 angstroms and about 15,000 angstroms. The interconnects 740 may comprise copper, tungsten, gold, aluminum, carbon nano-tubes, carbon fullerenes, refractory metals, and/or other materials, and may be formed by CVD, ALD, PVD, and/or other processes.

Thus, the present disclosure provides a method of manufacturing a memory device including forming an electrode over a substrate and subsequently forming a dielectric feature over the substrate and adjacent at least a portion of a sidewall of the electrode to at least partially define or otherwise form a contact region of the sidewall. A phase change feature is then formed in contact with or otherwise proximate the contact region and the dielectric feature. For example, the phase change feature may comprise a chalcogenide material.

A memory device is also introduced in the present disclosure. In one embodiment, the memory device includes an electrode located over a substrate and a dielectric feature adjacent at least a portion of a sidewall of the electrode and over the substrate, thereby at least partially defining an electrical contact region of the sidewall. A phase change feature contacts or is otherwise located proximate the contact region and the dielectric feature, possibly extending over a portion of the electrode in a direction substantially parallel to the substrate.

The present disclosure also provides an integrated circuit device including, in one embodiment, a substrate, a plurality of memory devices, and at least one interconnect electrically connecting ones of the plurality of memory devices and extending at least partially through a dielectric layer. Each of the plurality of memory devices includes: (1) an electrode located over the substrate; (2) a dielectric feature located over the substrate and adjacent at least a portion of a sidewall of the electrode, thereby at least partially defining a contact region of the sidewall; and (3) and a phase change feature contacting or otherwise proximate the contact region and extending over at least a portion of the electrode relative to the substrate.

The foregoing has outlined features of several embodiments according to aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A device, comprising:
   an electrode formed on and in direct contact with a substrate;
   a dielectric feature adjacent at least a portion of a sidewall of the electrode and over the substrate, thereby at least partially defining an electrical contact region of the sidewall, wherein the electrical contact region comprises an implanted impurity to create a treated portion comprising less than all of the electrode; and
   a phase change feature proximate the contact region and the dielectric feature.

2. The device of claim 1 wherein the phase change feature electrically contacts the contact region.

3. The device of claim 1 wherein the phase change feature extends over at least a portion of the electrode relative to the substrate.

4. The device of claim 1 wherein further comprising:
   at least one dielectric layer covering the electrode relative to the substrate; and
   at least one interconnect extending at least partially through the at least one dielectric layer and electrically connecting the device and another device.

5. The device of claim 1 wherein a height of the contact region is less than about 50% of a thickness of the electrode.

6. The device of claim 1 wherein a height of the contact region is less than about 50% of a thickness of the electrode, and wherein the thickness of the electrode ranges between about 1000 angstroms and about 8000 angstroms.

7. The device of claim 5 wherein a height of the contact region ranges between about 150 angstroms and about 1000 angstroms.

8. The device of claim 1 wherein a thickness of the phase change feature ranges between about 50 angstroms and about 1000 angstroms.

9. The device of claim 1 wherein the phase change feature comprises a chalcogenide.

10. The device of claim 1 wherein the phase change feature comprises a binary material alloy.

11. The device of claim 1 wherein the phase change feature comprises a ternary material alloy.

12. The device of claim 1 wherein the phase change feature comprises a quaternary material alloy.

13. The device of claim 1 wherein the phase change feature comprises a Te alloy.

14. The device of claim 1 wherein the phase change feature comprises an implanted impurity.

15. The device of claim 1 wherein the electrode comprises an implanted impurity.

16. The device of claim 1 further comprising a protective layer located on the electrode.

17. The device of claim 16 wherein a thickness of the protective layer ranges between about 30% and about 250% of a height of the contact region.

18. The device of claim 16 wherein the phase change feature is planarized to be substantially coplanar with one of the electrode and the protective layer.

19. An integrated circuit device, comprising:
    a substrate;
    a plurality of memory devices each including:
       an electrode formed on and in direct contact with a substrate;
       a dielectric feature located over the substrate and adjacent at least a portion of a sidewall of the electrode, thereby at least partially defining a contact region of the sidewall, wherein the electrical contact region comprises an implanted impurity to create a treated portion comprising less than all of the electrode; and
       a phase change feature proximate the contact region and extending over at least a portion of the electrode relative to the substrate; and
    at least one interconnect electrically connecting ones of the plurality of memory devices and extending at least partially through a dielectric layer.

20. The integrated circuit device of claim 19 wherein, for at least one of the plurality of memory devices, the phase change feature electrically contacts the contact region.

21. The integrated circuit device of claim 19 wherein the phase change feature comprises a chalcogenide.

22. The integrated circuit device of claim 19 wherein the phase change feature comprises a Te alloy.

23. The integrated circuit device of claim 19 wherein the dielectric feature comprises a material having a dielectric constant less than about 3.9.

24. The integrated circuit device of claim 19 wherein the substrate comprises strained silicon.

25. The integrated circuit device of claim 19 wherein the substrate comprises diamond.

* * * * *